(12) United States Patent
Kamimura et al.

(10) Patent No.: US 7,265,695 B2
(45) Date of Patent: Sep. 4, 2007

(54) VIDEO SIGNAL PROCESSING APPARATUS AND VIDEO SIGNAL PROCESSING METHOD

(75) Inventors: Shigeki Kamimura, Tsurugashima (JP); Tadashi Oguma, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 200 days.

(21) Appl. No.: 11/149,187

(22) Filed: Jun. 10, 2005

(65) Prior Publication Data
US 2005/0280642 A1 Dec. 22, 2005

(30) Foreign Application Priority Data
Jun. 16, 2004 (JP) ............... 2004-178482

(51) Int. Cl.
*H03M 1/12* (2006.01)
*H04N 9/73* (2006.01)

(52) U.S. Cl. ............ 341/120; 348/572; 345/204

(58) Field of Classification Search ........ 341/118, 341/120; 348/180, 181, 185, 572, 603, 645, 348/646, 647, 648, 655, 656, 657, 673, 678, 348/687; 345/204
See application file for complete search history.

(56) References Cited
U.S. PATENT DOCUMENTS 4,053,946 A * 10/1977 Opittek et al. .............. 345/501
4,517,586 A * 5/1985 Balaban et al. ............ 348/572
4,799,106 A * 1/1989 Moore et al. .............. 348/619
5,087,973 A * 2/1992 Kawahara .................. 348/572
7,034,722 B2 * 4/2006 Thomas ..................... 341/120
7,176,908 B2 * 2/2007 Matsubara et al. ......... 345/204

FOREIGN PATENT DOCUMENTS

| EP | 0 462 804 A2 | 12/1991 |
|----|--------------|---------|
| JP | 05-243998 | 9/1993 |
| JP | 11-219154 | 8/1999 |

OTHER PUBLICATIONS

European Search Report dated Oct. 4, 2005 for Appln. No. 05104305.7.

* cited by examiner

*Primary Examiner*—Howard L. Williams
(74) *Attorney, Agent, or Firm*—Pillsbury Winthrop Shaw Pittman, LLP

(57) ABSTRACT

A video signal processing apparatus comprises an A/D converter for digitizing an analog video signal, an integration circuit for integrating the digitized video signal within a predetermined integration range, a picture display device for displaying a picture based on an integration output, and a control unit which, when an offset adjustment signal is inputted to the A/D converter, corrects the offset value so as to eliminate a difference between the integration value of the integration circuit and a preliminarily set specified value, and determines whether or not offset adjustment is completed based on the number of times when the corrected offset value is within a range defined by adding a predetermined error to the specified value.

8 Claims, 8 Drawing Sheets

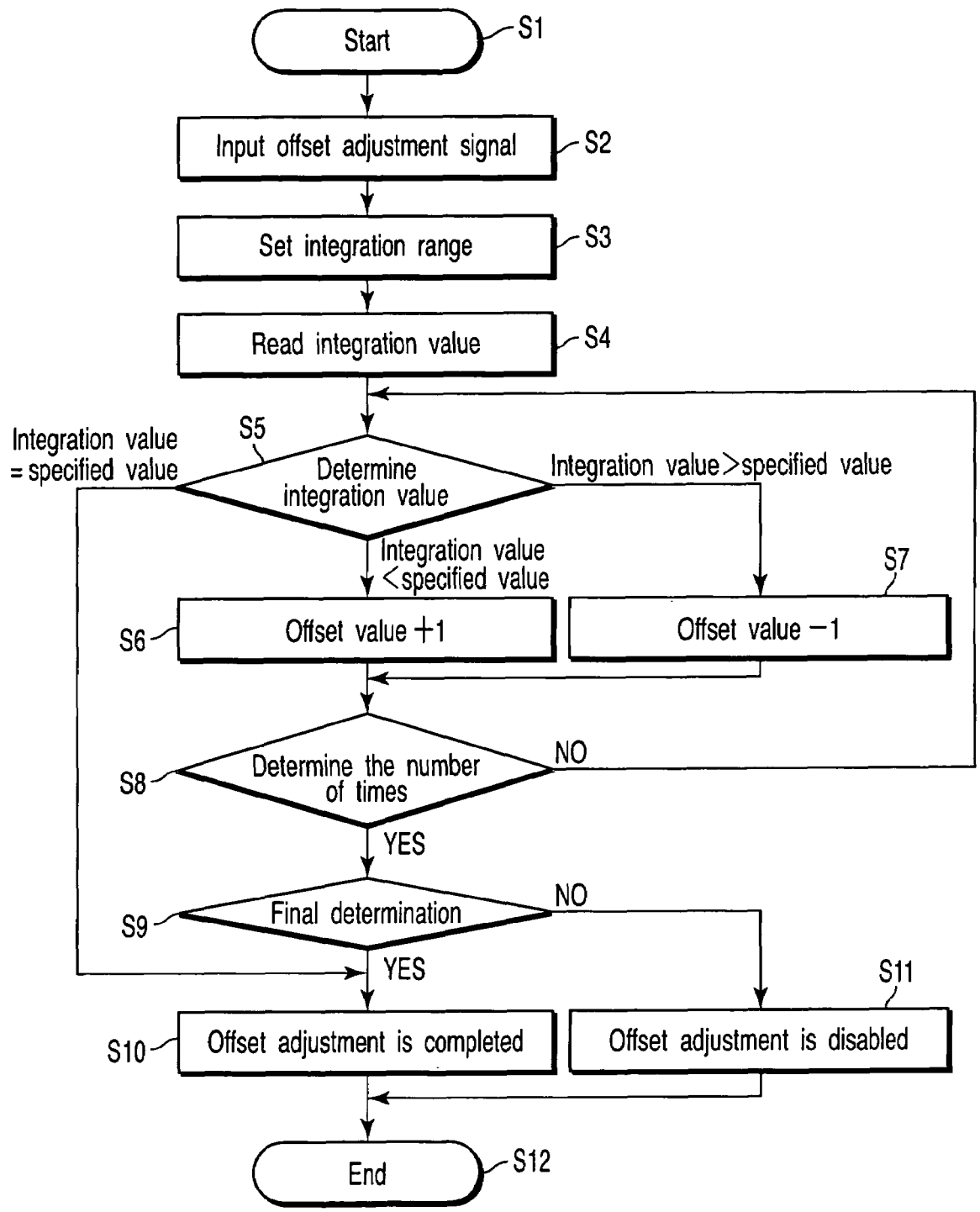
F I G. 4

VIDEO SIGNAL PROCESSING APPARATUS AND VIDEO SIGNAL PROCESSING METHOD

CROSS-REFERENCE TO RELATED APPLICATIONS

This application is based upon and claims the benefit of priority from prior Japanese Patent Application No. 2004-178482, filed Jun. 16, 2004, the entire contents of which are incorporated herein by reference.

BACKGROUND OF THE INVENTION

1. Field of the Invention

The present invention relates to a video signal processing apparatus and a video signal processing method for displaying video signals on particularly a flat panel type display.

2. Description of the Related Art

As well known, in recent years, a flat panel type display using for example, a liquid crystal display panel, a plasma display panel or the like has been widely prevalent. As this kind of the flat panel type display, a picture projection type display or a projector also has tended to be prevail.

In such a flat panel type display, after an analog video signal to be inputted in the form of an RGB signal or a YCbCr signal is digitized, the digitized signal is subjected to integral processing and supplied to the display panel, thereby displaying a picture.

In this flat panel type display, it is necessary to implement offset adjustment and gain adjustment on an analog/digital (A/D) converter for digitizing an analog video signal in order to obtain optimal A/D conversion accuracy.

Jpn. Pat. Appln. KOKAI Publication No. 5-243998 has disclosed a configuration for adjusting an A/D converter to obtain an optimal output when an offset adjustment reference voltage is inputted and for adjusting the A/C converter to obtain an optimal output when a gain adjustment reference voltage is inputted.

However, the A/D conversion technology for digitizing the analog video signal is still on a development stage, so that development of a method more suitable for actual realization has been strongly demanded in several viewpoints as regards the offset and gain adjustments.

BRIEF SUMMARY OF THE INVENTION

According to one aspect of the present invention, there is provided a video signal processing apparatus comprising: an A/D converting unit configured to digitize an inputted analog video signal; an integration unit configured to integrate the video signal digitized by the A/D converting unit within a predetermined integration range; a picture display unit configured to display a picture based on an output signal of the integration unit; a detecting unit configured to, when an analog video signal to be inputted to the A/D converting unit is an adjustment signal of the A/D converting unit, detect a difference between an integration value obtained by the integration unit and a preliminarily set specified value; a correcting unit configured to, when the difference is detected by the detecting unit, correct an adjusted value of the A/D converting unit such that the integration value is equal to the specified value; and a determining unit configured to determine whether or not the adjustment is completed based on the number of times when the adjusted value corrected by the correcting unit is within a range defined by adding a predetermined error to the specified value.

According to another aspect of the present invention, there is provided a video signal processing method comprising: a first step of digitizing an inputted analog video signal by an A/D converting unit; a second step of integrating the digitized video signal by an integration unit within a predetermined integration range; a third step of displaying a picture by a picture display unit based on an output signal of the integration unit; a fourth step of, when an analog video signal to be inputted to the A/D converting unit is an adjustment signal of the A/D converting unit, detecting a difference between an integration value obtained by the integration unit and a preliminarily set specified value; a fifth step of, when the difference is detected, correcting an adjusted value of the A/D converting unit such that the integration value is equal to the specified value; and a sixth step of determining whether or nor the adjustment is completed based on the number of times when the adjusted value corrected by the correcting unit is within a range defined by adding a predetermined error to the specified value.

BRIEF DESCRIPTION OF THE SEVERAL VIEWS OF THE DRAWING

FIG. 4 is a flow chart for explaining the offset adjustment operation of the A/D converter according to the embodiment;

DETAILED DESCRIPTION OF THE INVENTION

Figure 1:
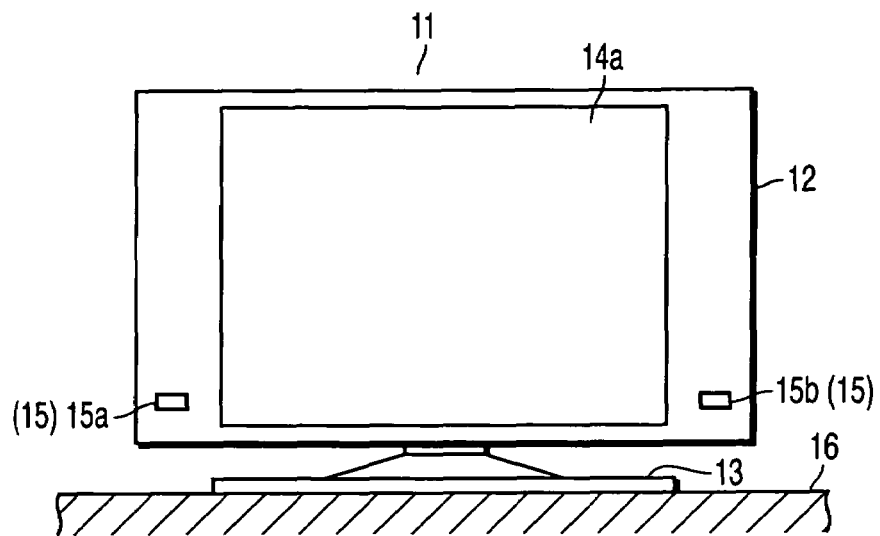
FIG. 1 is a front view for explaining an appearance of a picture display apparatus according to an embodiment of the present invention.

Hereinafter, an embodiment of the present invention will be described in detail with reference to the accompanying drawings. FIG. 1 is a front view of a flat panel type picture display apparatus 11 of this embodiment.

The picture display apparatus 11 is mainly comprised of a cabinet 12 and a supporting base 13 for supporting the cabinet 12. In the cabinet 12, a display panel 14a of a picture display device 14, which will be described later, is disposed in the center of a front face thereof.

Further, in the cabinet 12, an operation unit 15 including a power switch 15a, a reception unit 15b for receiving operation information sent from a wireless remote controller (not shown) and the like is disposed on both sides of the display panel 14a.

On the other hand, the supporting base 13 is coupled with the center of the bottom face of the cabinet 12 freely rotatably, and is configured to support the cabinet 12 in its standing position in a state in which it rests on a predetermined base 16 horizontally.

Figure 2:
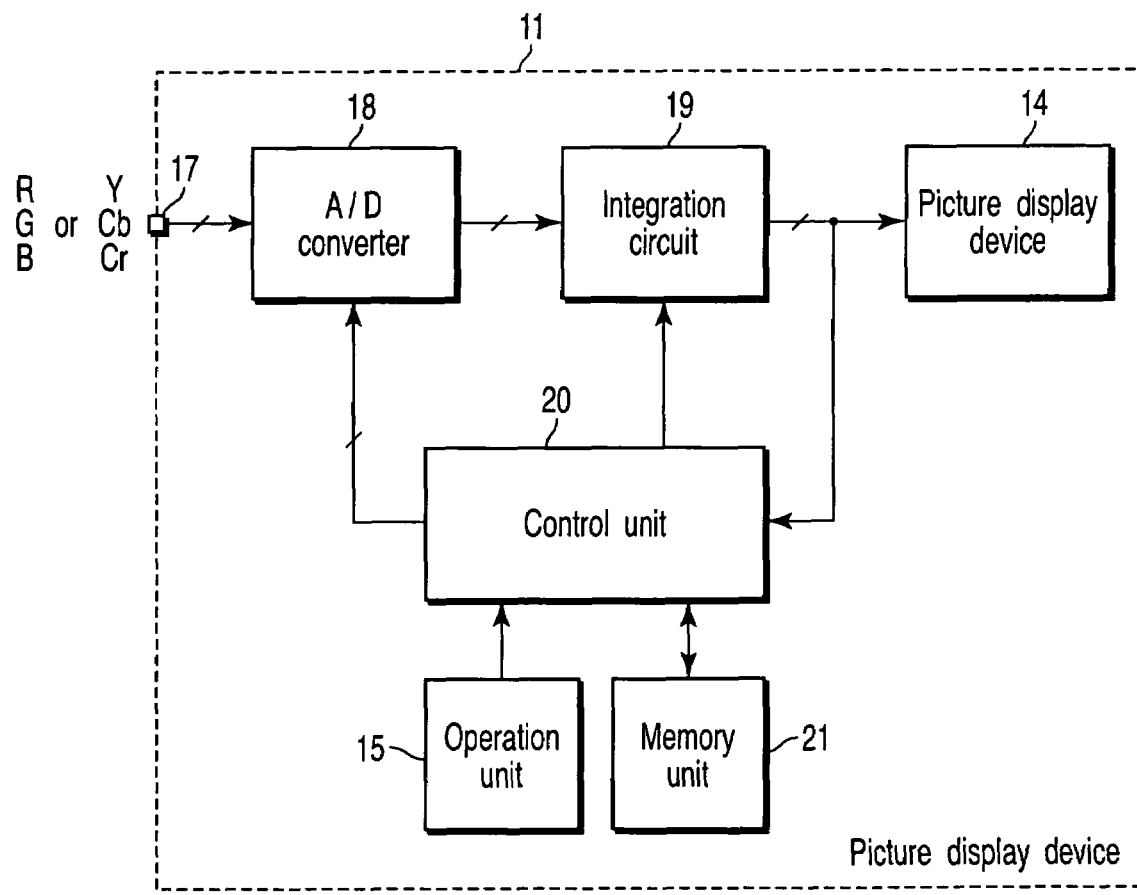
FIG. 2 is a block diagram for explaining a signal processing system of the picture display apparatus according to the embodiment.

FIG. 2 shows a signal processing system of the picture display apparatus 11. That is, in FIG. 2, reference numeral 17 denotes a video signal input terminal. In the video signal input terminal 17 is inputted an analog video signal in the form of an RGB signal or in the form of a YCbCr signal.

The analog video signal inputted to the video signal input terminal 17 is supplied to an A/D converter 18, which converts the signal to a digital signal. The digital signal is integrated for a specified period by means of an integration circuit 19, and then supplied to the picture display device 14 and displayed on the display panel 14a.

Here, in the picture display apparatus 11, its entire operation including the above-described display operation is totally controlled by a control unit 20. The control unit 20 incorporates a central processing unit (CPU) and the like, which receives operation information from the operation unit 15 and controls respective units so as to reflect contents of the operation.

In this case, the control unit utilizes a memory unit 21. That is, the memory unit 21 mainly comprises a read only memory which stores a control program to be executed by the CPU of the control unit 20, a random access memory which provides the CPU with a work area, and a nonvolatile memory which stores various kinds of specified values, setting information, control information and the like.

The control unit 20 outputs an integral range control signal indicating an integral range to the integration circuit 19, reads an integral value outputted from the integration circuit 19 in this integral range and executes offset adjustment and gain adjustment of the A/D converter 18 in accordance with the integral value.

When the inputted analog video signal is the RGB signal, the A/D converter 18, the integration circuit 19 and the control unit 20 perform A/D conversion processing, integration processing and adjustment processing upon the R signal, G signal and B signal. When the inputted analog video signal is the YCbCr signal, the A/D converter 18, the integration circuit 19 and the control unit 20 perform A/D conversion processing, integration processing and adjustment processing upon the Y signal, Cb signal and Cr signal.

Figure 3:
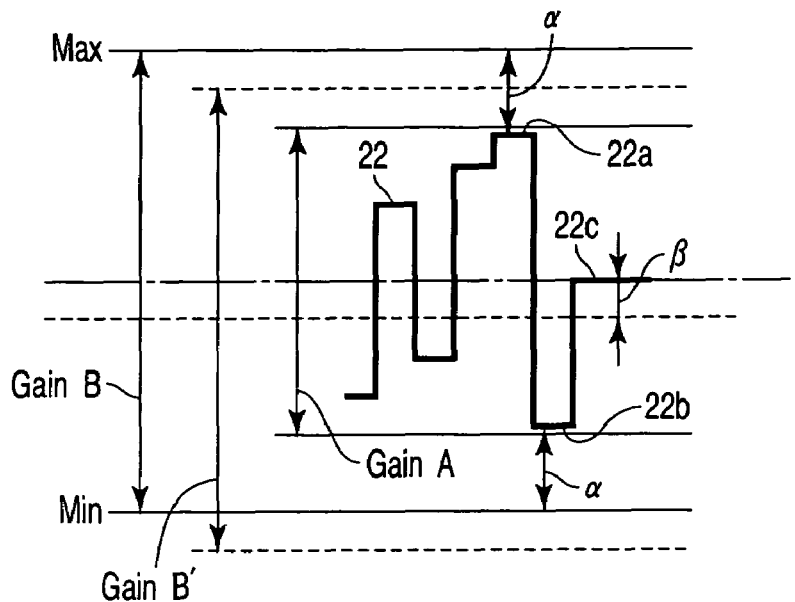
FIG. 3 is a diagram for explaining adjustment of offset and gain of an A/D converter according to the embodiment.

FIG. 3 describes adjustments of offset and gain which are to be adjusted by the A/D converter 18. That is, comparison is made between a case where a signal conversion range when the A/D converter 18 converts an inputted analog video signal 22 to a digital signal has a gain A substantially corresponding to the amplitude of the analog video signal 22 and a case where it has gain B wider than the gain A.

Assuming that the gain A is ⅔ times the gain B in this case, the case where it is set by the gain A provides a value 1.5 times the case where it is set by the gain B as for a digital signal produced by conversion to the same analog video signal 22.

That is, assume that respective central levels of the gain A, gain B and analog video signal 22 coincide at a position indicated by a dot and dash line in FIG. 3. In the case of the gain A, a maximum level portion 22a of the analog video signal 22 reaches substantially near the maximum level Max of the signal conversion range, and a minimum level portion 22b of the analog video signal 22 reaches substantially near the minimum level Min of the signal conversion range.

Contrary to this, in the case of the gain B, the maximum level portion 22a of the analog video signal 22 reaches a position lower by α than the maximum level Max of the signal conversion range, and the minimum level portion 22b of the analog video signal 22 reaches a position higher by α than the minimum level Min of the signal conversion range.

As a result, gain adjustment of the A/D converter 18 is needed according to the amplitude of the inputted analog video signal 22.

Even if the same gain width as the gain B indicated with a solid line is provided, the central level, namely, a central point of conversion to digital signals may be deflected by an amount corresponding to β depending on a situation as a gain B' indicated with a dotted line in the figure. In this case, as compared with the case of the gain B, offset by the amount corresponding to β is generated with respect to a central level portion 22c of the analog video signal 22.

Thus, the offset adjustment of the A/D converter 18 is necessary according to the central level of the inputted analog video signal 22. For the YCbCr signal to be inputted, a pedestal level after digitalization is preferred to be 80 h. Accordingly, the offset adjustment is needed such that the pedestal level after the digitalization becomes 80 h.

FIG. 4 shows a flow chart of the offset adjustment operation. First, after the processing is started (step S1), an analog video signal for offset adjustment is inputted to the A/D converter 18 through the video signal input terminal 17 in step S2.

Here, when the analog video signal for offset adjustment is the RGB signal, a minimum level Min (black) level is inputted. In addition, when the analog video signal for offset adjustment is the YcbCr signal, its central level is inputted. If the amplitude range after digitalization is 00 h to FFh, the pedestal level after digitalization is 80 h.

Then, in step S3, the control unit 20 sets an integration range to the integration circuit 19, that is, a signal pickup range for reading an integration value from the integration circuit 19, and in step S4, the control unit 20 reads an integration value in the previously set integration range from the integration circuit 19.

Thereafter, in step S5, the control unit 20 compares the integration value read out from the integration circuit 19 with the specified value preliminarily set in the memory unit 21, and determines which state is established from among the following three states, "integration value=specified value", "integration value<specified value" and "integration value>specified value".

If it is determined that "integration value=specified value" is established, the control unit 20 determines that the offset adjustment is completed in step S10, and terminates the processing (step S12).

If it is determined that "integration value<specified value" is established in the step S5, the control unit 20 controls the A/D converter 18 to increment a current offset value with 1 in step S6.

On the other hand, if it is determined that "integration value>specified value" is established in the step S5, the control unit 20 controls the A/D converter 18 to decrement a current offset value with 1 in step S7.

That is, the control unit 20 corrects the offset value of the A/D converter 18 step by step such that the integration value becomes equal to the specified value.

After the step S6 or S7, the control unit 20 determines whether or not the number of times when the integration value is within a range of ±1 to the specified value exceeds a preliminarily set number of times (for example, 30 to 40). When it is determined that it does not exceed (NO), the procedure is returned to the processing of step S5.

If it is determined that the number of times when the integration value is within the range of ±1 to the specified value exceeds the preliminarily set number of times (YES) in the step S8, the control unit 20 executes final determination to determine whether or not the integration value is within the range of ±1 to the specified value in the step S9.

If it is determined that it is within the range (YES), the control unit 20 determines that the offset adjustment is completed in step S10, and terminates the processing (step S12). If it is determined that it is not within the range (NO), the control unit 20 determines that the offset adjustment is disabled in step S11, and terminates the processing (step S12).

Figure 5:
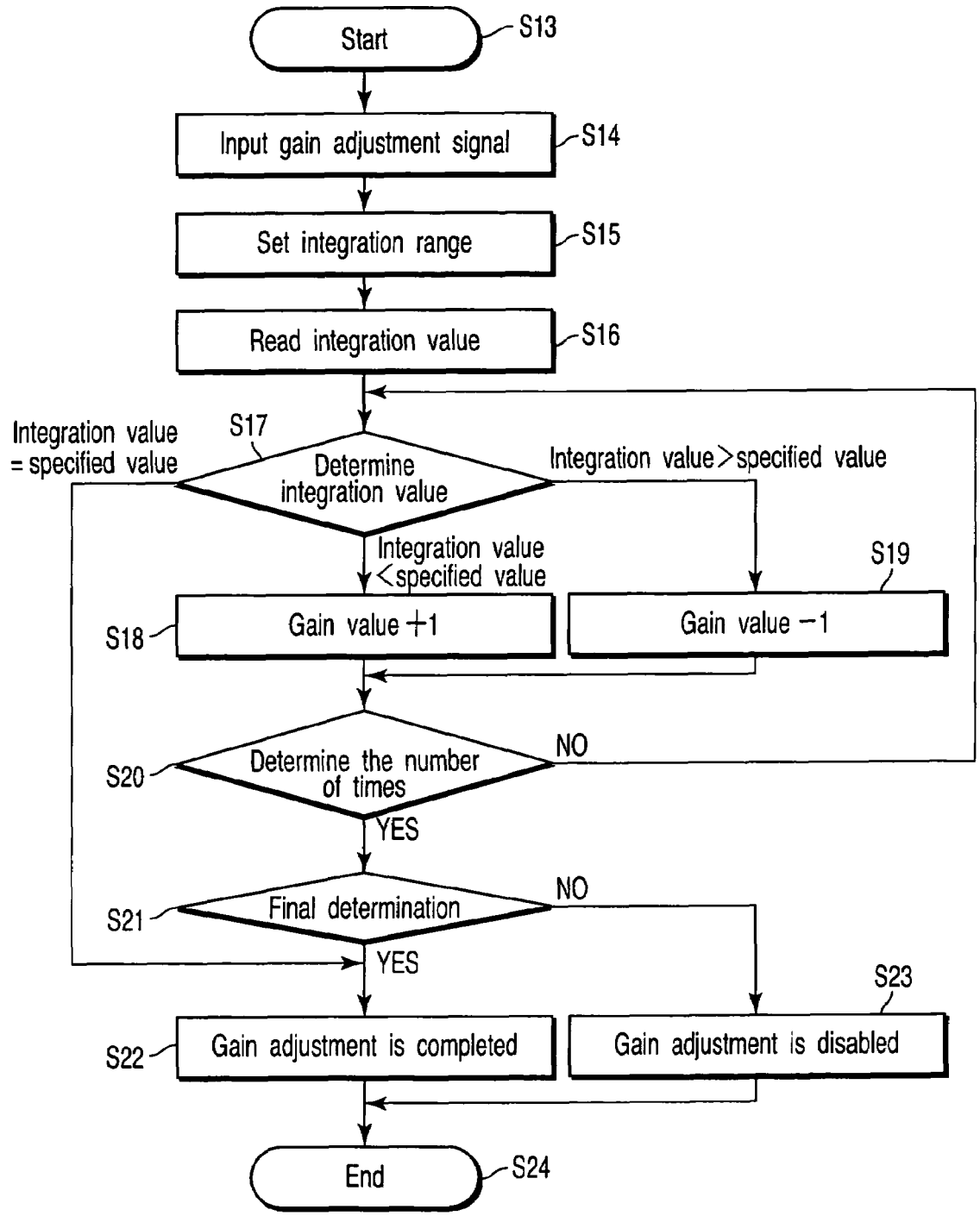
FIG. 5 is a flow chart for explaining the gain adjustment operation of the A/D converter according to the embodiment.

FIG. 5 shows a flow chart of the gain adjustment operation. After the processing is started (step S13), an analog video signal for gain adjustment is inputted to the A/D converter 18 through the video signal input terminal 17 in step S14. In this case, the analog video signal for gain adjustment is the RGB signal, and its maximum level Max (white level) is inputted.

Then, the control unit 20 sets an integration range to the integration circuit 19, that is, a signal pickup range for reading out an integration value from the integration circuit 19 in step S15, and reads out an integration value in the previously set integration range from the integration circuit 19 in step S16.

Thereafter, the control unit 20 compares the integration value read from the integration circuit 19 with the specified value set in the memory unit 21, and determines which state is established from among the following three states, "integration value=specified value", "integration value<specified value" and "integration value>specified value".

If it is determined that "integration value=specified value" is established, the control unit 20 determines that the gain adjustment is completed in step S22, and terminates the processing (step S24).

If it is determined that "integration value<specified value" is established in the step S17, the control unit 20 controls the A/D converter 18 to increment a current offset value with 1 in step S18.

On the other hand, if it is determined that "integration value>specified value" is established in the step S17, the control unit 20 controls the A/D converter 18 to decrement the current offset value with 1 in step S19.

That is, the control unit 20 corrects the gain value of the A/D converter 18 step by step such that the integration value becomes equal to the specified value.

After the step S18 or S19, the control unit 20 determines whether or not the number of times when the integration value is within a range of ±1 to the specified value exceeds a preliminarily set number of times (for example, 30 to 40). When it is determined that it does not exceed (NO), the procedure is returned to the processing of step S17.

If it is determined that the number of times when the integration value is within the range of ±1 to the specified value exceeds the preliminarily set number of times (YES) in the step S20, the control unit 20 executes final determination to determine whether or not the integration value is within the range of ±1 to the specified value in the step S21.

If it is determined that it is within the range (YES), the control unit 20 determines that the offset adjustment is completed in step S22, and terminates the processing (step S24). If it is determined that it is not within the range (NO), the control unit 20 determines that the offset adjustment is disabled in step S23, and terminates the processing (step S24).

According to the above-mentioned embodiment, even if an integration value obtained by inputting offset adjustment and gain adjustment analog video signals to the A/D converter 18 does not coincide with a preliminarily set specified value, if it is within the allowance range obtained by incrementing/decrementing the specified value with 1 at a predetermined number of times or more, it is determined that the adjustment is completed. Consequently, the efficiency of the offset adjustment and gain adjustment to the A/D converter 18 can be intensified.

Figure 6:
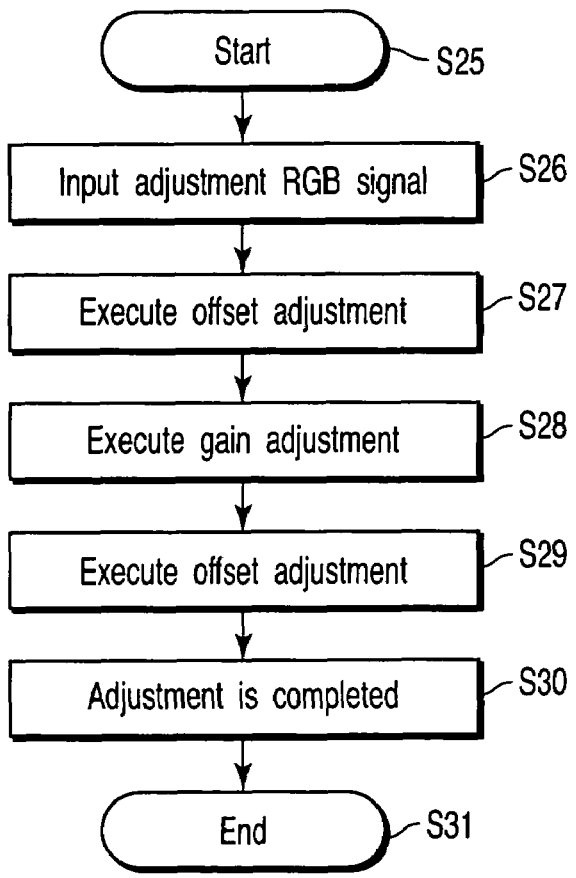
FIG. 6 is a flow chart for explaining the adjustment of offset and gain of the A/D converter with an RGB signal according to the embodiment.

FIG. 6 shows a flow chart of an operation for automatically adjusting the offset and gain by inputting offset adjustment and gain adjustment analog RGB signals to the A/D converter 18.

Figure 7:
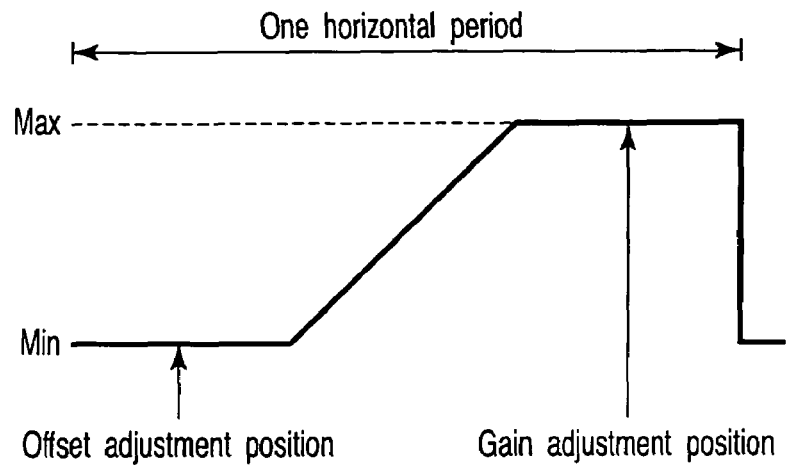
FIG. 7 is a diagram for explaining the RGB signal for use in the adjustment of offset and gain of the A/D converter according to the embodiment.

First, after the processing is started (step S25), the adjustment analog RGB signal is inputted to the A/D converter 18 through the video signal input terminal 17 in step S26. In the adjustment analog RGB signal, a minimum level Min for offset adjustment and a maximum level Max for gain adjustment are mixed within a single horizontal period as shown in FIG. 7.

In this case, the control unit 20 sets an offset adjustment integration range in a portion of the minimum level Min of the inputted RGB signal and a gain adjustment integration range in a portion of the maximum level Max.

As a consequence, the control unit 20 executes the offset adjustment described in FIG. 4 on the offset adjustment integration range in step S27, and executes the gain adjustment described in FIG. 5 on the gain adjustment integration range in step S28.

In step S29, the control unit 20 readjusts the offset slightly deflected by the gain adjustment in step S28, determines that the automatic adjustment of the offset and gain is completed in step S30, and terminates the processing (step S31).

As for the offset adjustment and gain adjustment, if the offset adjustment is performed first and then they are executed alternately several times, a more reliable adjustment can be achieved.

A result of the offset adjustment with the G signal in steps S27, S29 can be also applied to the Y signal. Further, a result of the gain adjustment with the RGB signal in step S28 can be also applied to the YCbCr signal.

Figure 8:
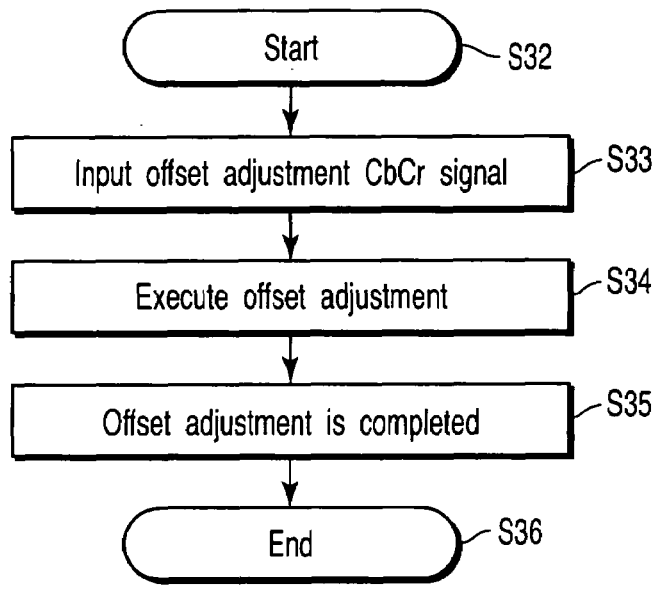
FIG. 8 is a flow chart for explaining the offset adjustment operation of the A/D converter with a YCbCr signal according to the embodiment.

FIG. 8 shows a flow chart of an operation of automatically adjusting the offset by inputting the offset adjustment analog CbCr signal to the A/D converter 18. First, after the processing is started (step S32), the offset adjustment analog CbCr signal is inputted to the A/D converter 18 through the video signal input terminal 17 in step S33.

Figure 9:
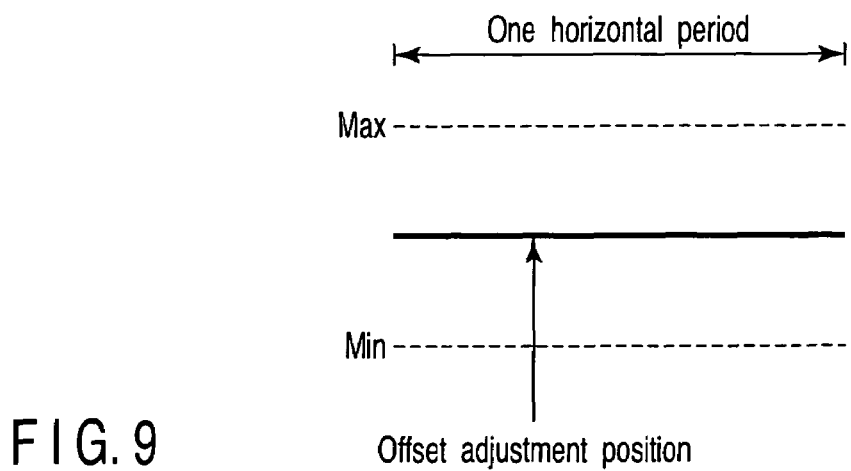
FIG. 9 is a diagram for explaining the YCbCr signal for use in the offset adjustment operation of the A/D converter according to the embodiment.

The analog CbCr signal needs to be a colorless flat signal, for example, a mono-chrome signal as shown in FIG. 9 for usage. Then, the control unit 20 sets an offset adjustment integration range at an arbitrary portion of the inputted CbCr signal.

Then, the control unit 20 executes the offset adjustment described in FIG. 4 upon the offset adjustment integration range in step S34. Because the analog CbCr signal is used in this case, the specified value is a central level between the maximum level Max and the minimum level Min, that is, in case of 8 bits, 80 h which is the central value of 00 h to FFh. Thereafter, the control unit 20 confirms that the automatic adjustment of the offset is completed in step S35, and terminates the processing (step S36).

Figure 10:
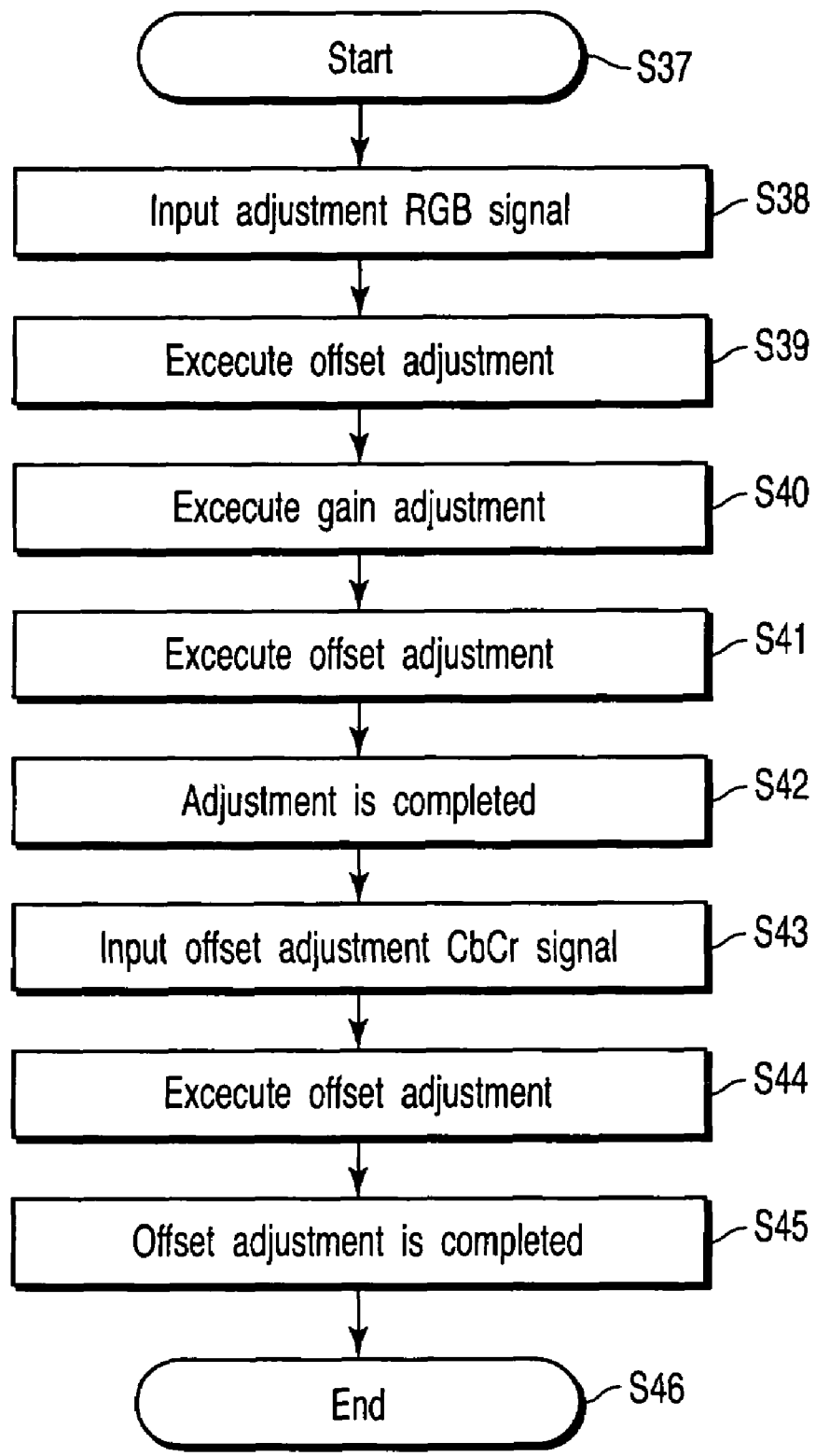
FIG. 10 is a flow chart for explaining that the adjustment of offset and gain of the A/D converter with the RGB signal and the adjustment of the offset with the YCbCr signal are carried out continuously.

FIG. 10 shows a flow chart of an operation of inputting the offset adjustment and gain adjustment analog RGB signals into the A/D converter 18 so as to automatically adjust the offset and gain, and subsequently, inputting the offset adjustment analog CbCr signal into the A/D converter 18 so as to automatically adjust the offset.

That is, after the processing is started (step S37), the adjustment analog RGB signal is inputted to the A/D converter 18 through the video signal input terminal 17 in step S38. Then, the control unit 20 executes the offset adjustment described in FIG. 4 on the offset adjustment integration range in step S39, and executes the gain adjustment described in FIG. 5 on the gain adjustment integration range in step S40.

Then, in step S41, the control unit 20 readjusts the offset slightly deflected in the gain adjustment in step S40, and in step S42, the control unit 20 confirms that the automatic adjustment of the offset and gain is completed.

Thereafter, the offset adjustment analog CbCr signal is inputted to the A/D converter 18 through the video signal input terminal 17 in step S43. Then, the control unit 20 executes the offset adjustment described in FIG. 4 upon the offset adjustment integration range in step S44. After that, the control unit 20 confirms that the automatic adjustment of the offset is completed in step S45, and terminates the processing (step S46).

Figure 11:
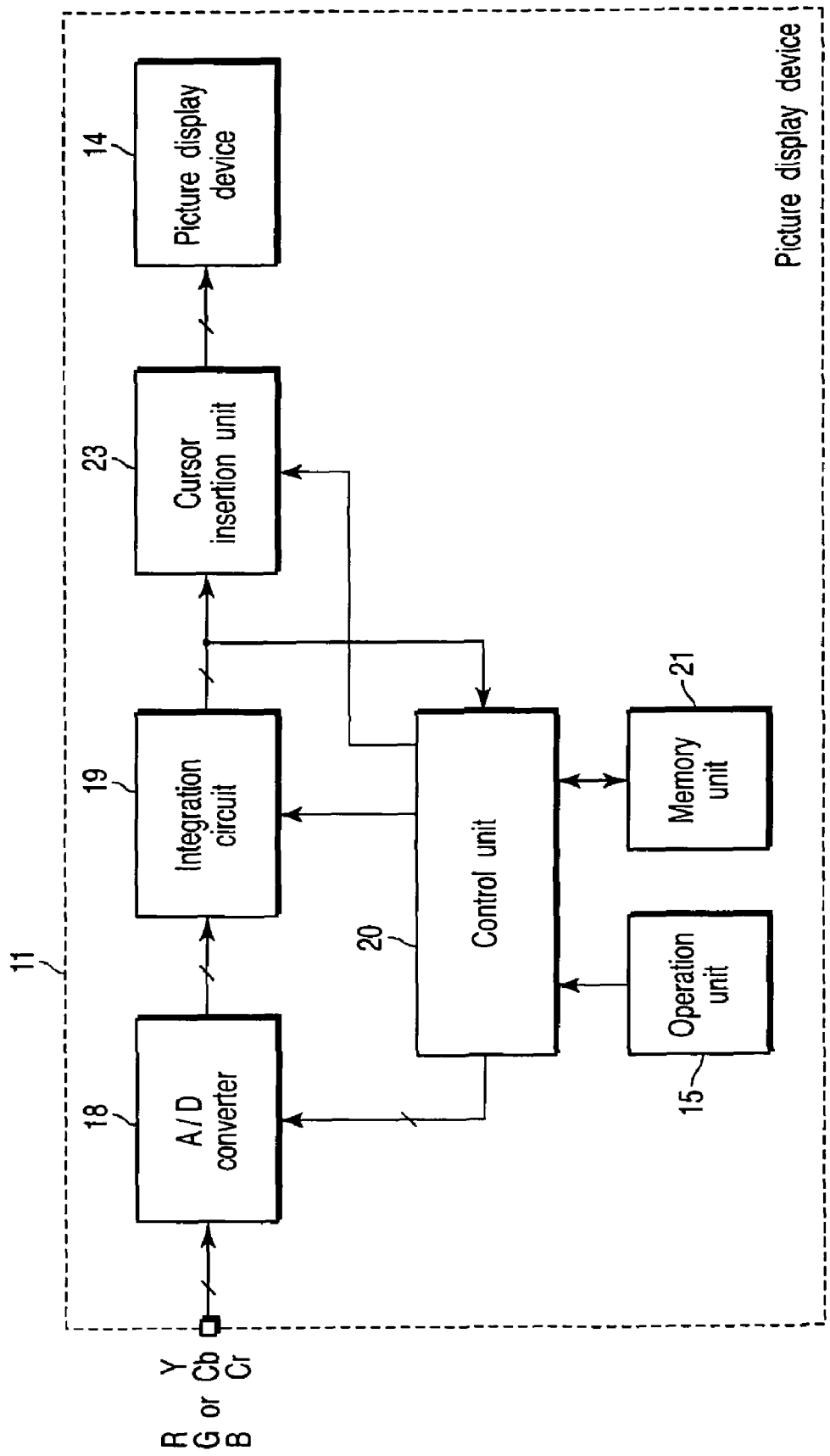
FIG. 11 is a block diagram for explaining a modification of the embodiment.

FIG. 11 shows a modification of the above-described embodiment. Explaining by attaching like reference numerals to the same components as in FIG. 2, a cursor insertion unit 23 for displaying a cursor on the picture display device 14 under the control of the control unit 20 is disposed between the integration circuit 19 and the picture display device 14.

If a signal obtained by processing a video signal within the integration range of the integration circuit 19 to a specified level is used as a cursor, an integrated range is displayed on the display panel 14a of the picture display device 14 during adjustment of the offset or gain. Thus, the user can determine whether or not the adjustment operation is being carried out properly because the integrated portion is displayed, thereby intensifying the reliability of adjustment.

Figure 12:
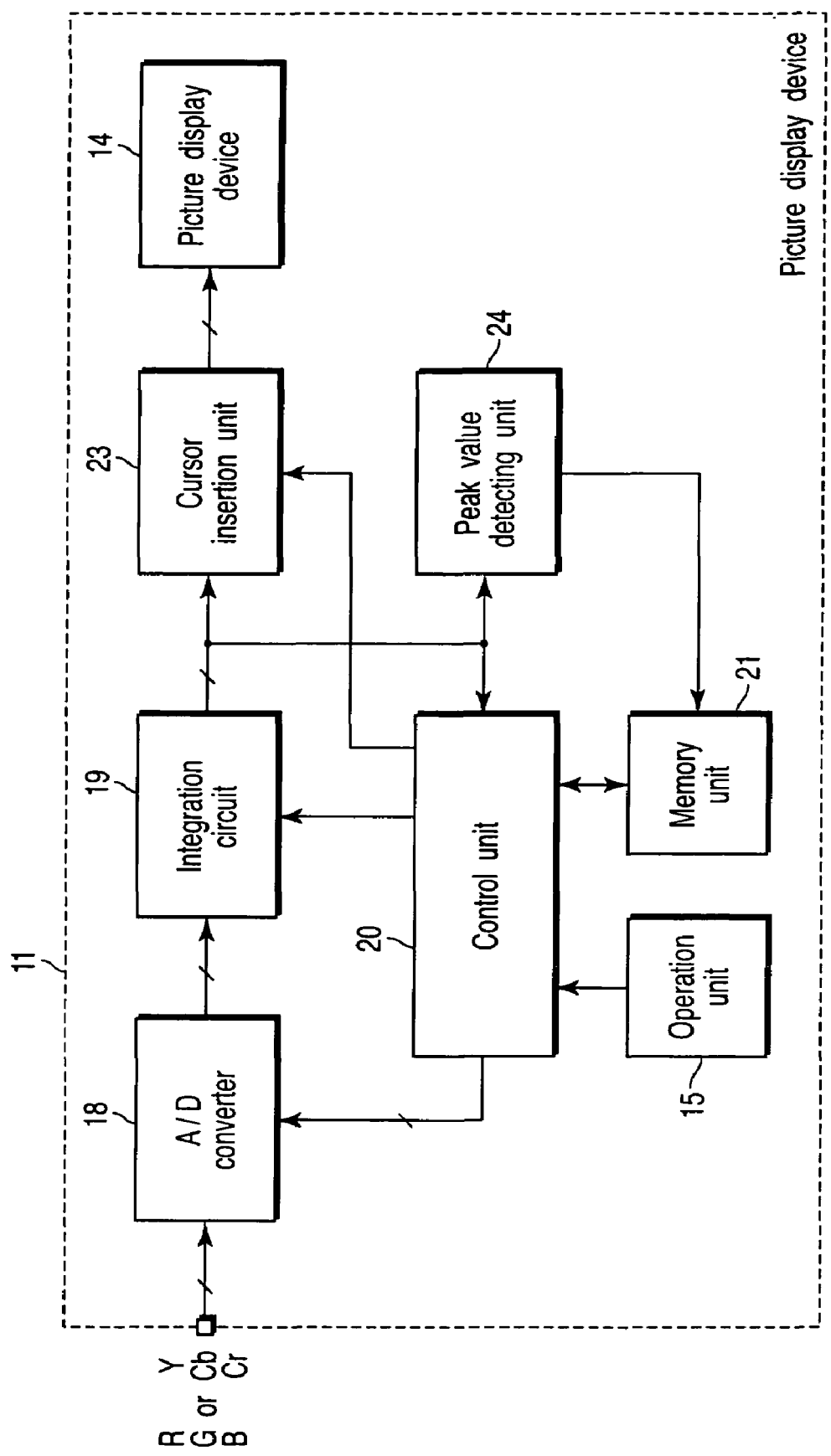
FIG. 12 is a block diagram for explaining another modification of the embodiment.

FIG. 12 shows further another modification of the above-described embodiment. Explaining by attaching like reference numerals to the same components as in FIG. 11, in FIG. 12, this embodiment includes a peak value detecting unit 24 for detecting maximum and minimum peak values of a video signal from the output of the integration circuit 19.

When, as a result of detection result of the peak value detecting unit 24, a detected video signal has a level higher than currently set gain, the specified value set in the memory unit 21 is changed such that the amplitude of the video signal is within the gain. Consequently, crush of a fine black detail or crush of a white portion of the video signal can be prevented.

In the meantime, the present invention is not restricted to the above-described embodiment but may be embodied by modifying its components in various ways within a scope not departing from the gist of the invention. In addition, by combining plural components disclosed in the above-described embodiment appropriately, various aspects of the invention can be achieved. For example, it is permissible to delete some components from the entire components indicated in the embodiment. Moreover, it is permissible to combine components of different embodiments appropriately.

What is claimed is:

1. A video signal processing apparatus comprising:
an A/D converting unit configured to digitize an inputted analog video signal;
an integration unit configured to integrate the video signal digitized by the A/D converting unit within a predetermined integration range;
a picture display unit configured to display a picture based on an output signal of the integration unit;
a detecting unit configured to, when an analog video signal to be inputted to the A/D converting unit is an adjustment signal of the A/D converting unit, detect a difference between an integration value obtained by the integration unit and a preliminarily set specified value;
a correcting unit configured to, when the difference is detected by the detecting unit, correct an adjusted value of the A/D converting unit such that the integration value is equal to the specified value;
a determining unit configured to determine whether or not the adjustment is completed based on the number of times when the adjusted value corrected by the correcting unit is within a range defined by adding a predetermined error to the specified value; and
a cursor generating unit configured to generate a cursor displayed on the picture display unit based on an output signal within a predetermined integration range of the integration unit, wherein an integration range under adjustment is displayed with the cursor.

2. A video signal processing apparatus according to claim 1, wherein
the detecting unit is configured to, when the analog video signal to be inputted to the A/D converting unit is an offset adjustment signal of the A/D converting unit, detect the difference between an integration value obtained by the integration unit and a preliminarily set specified value,
the correcting unit is configured to, when the difference is detected by the detecting unit, correct an offset value of the A/D converting unit such that the integration value is equal to the specified value, and
the determining unit is configured to determine whether or not the offset adjustment is completed based on the number of times when the offset value corrected by the correcting unit is within a range defined by adding a predetermined error to the specified value.

3. A video signal processing apparatus according to claim 2, wherein the offset adjustment signal of the A/D converting unit is a black level analog RGB signal or a colorless CbCr signal.

4. A video signal processing apparatus according to claim 1, wherein
the detecting unit is configured to, when the analog video signal to be inputted to the A/D converting unit is a gain adjustment signal of the A/D converting unit, detect a difference between an integration value obtained by the integration unit and a preliminarily set specified value,
the correcting unit is configured to, when the difference is detected by the detecting unit, correct a gain value of the A/D converting unit such that the integration value is equal to the specified value, and
the determining unit is configured to determine whether or not the gain adjustment is completed based on the number of times when the gain value corrected by the correcting unit is within a range defined by adding a predetermined error to the specified value.

5. A video signal processing apparatus according to claim 4, wherein the gain adjustment signal of the A/D converting unit is a white level analog RGB signal.

6. A video signal processing apparatus according to claim 4, further comprising:
- a peak detecting unit configured to detect a peak level of the output signal of the integration unit; and
- a changing unit configured to, when the peak level detected by the peak detecting unit exceeds a range of a gain set in the A/D converting unit, change the specified value such that all the output signals of the integration unit are within the gain of the A/D converting unit.

7. A method of controlling the video signal processing apparatus according to claim 1, comprising:
- a first step of executing the offset adjustment operation by the offset adjusting unit; and
- a second step of, after the first step, executing the gain adjustment operation by the gain adjusting unit and the offset adjustment operation by the offset adjusting unit alternately and repeatedly.

8. A method of controlling the video signal processing apparatus according to claim 1, comprising:
- a first step in which the offset adjusting unit carries out the offset adjustment operation by using an RGB signal as an offset adjustment signal;
- a second step in which, after the first step, the gain adjusting unit carries out the gain adjustment operation by using an RGB signal as a gain adjustment signal; and
- a third step in which, after the second step, the offset adjusting unit carries out the offset adjustment operation by using a CbCr signal as an offset adjustment signal.

* * * * *